United States Patent
Thomas, III et al.

(10) Patent No.: US 7,514,708 B2
(45) Date of Patent: Apr. 7, 2009

(54) 80 NANOMETER DIAMETER RESONANT TUNNELING DIODE WITH IMPROVED PEAK-TO-VALLEY RATIO

(75) Inventors: Stephen Thomas, III, West Los Angeles, CA (US); Ken Elliott, Thousand Oaks, CA (US); David H. Chow, Newbury Park, CA (US)

(73) Assignee: HRL Laboratories, LLC, Malibu, CA (US)

(*) Notice: Subject to any disclaimer, the term of this patent is extended or adjusted under 35 U.S.C. 154(b) by 380 days.

(21) Appl. No.: 10/420,346

(22) Filed: Apr. 22, 2003

(65) Prior Publication Data

US 2003/0230759 A1    Dec. 18, 2003

Related U.S. Application Data

(62) Division of application No. 09/924,699, filed on Aug. 7, 2001, now Pat. No. 6,566,284.

(51) Int. Cl.
*H01L 29/06* (2006.01)
(52) U.S. Cl. .................... 257/14; 257/25; 257/30
(58) Field of Classification Search .......... 257/14, 257/23, 25, 26, 29, 30
See application file for complete search history.

(56) References Cited

U.S. PATENT DOCUMENTS

| | | | | |
|---|---|---|---|---|
| 5,162,243 A * | 11/1992 | Streit et al. | ............ | 438/312 |
| 5,516,712 A * | 5/1996 | Wei et al. | ............ | 438/59 |
| 5,563,087 A * | 10/1996 | Shen et al. | ............ | 438/507 |
| 5,593,908 A * | 1/1997 | Jovanovic et al. | ............ | 438/172 |
| 5,606,178 A * | 2/1997 | Schulman et al. | ............ | 257/25 |
| 5,675,295 A * | 10/1997 | Brebels et al. | ............ | 331/105 |
| 5,705,825 A * | 1/1998 | Ando | ............ | 257/25 |
| 5,714,768 A | 2/1998 | Ovshindky et al. | | |
| 5,985,025 A * | 11/1999 | Celii et al. | ............ | 117/85 |
| 6,201,258 B1 | 3/2001 | Seabaugh | | |
| 6,218,677 B1 * | 4/2001 | Broekaert | ............ | 257/22 |
| 6,316,832 B1 | 11/2001 | Tsuzuki et al. | | |
| 6,560,259 B1 * | 5/2003 | Hwang | ............ | 372/45 |

OTHER PUBLICATIONS

Quirk et al.; Semiconductor Manufacturing Technology (2001), Prentice Hall, pp. 522 and 543.*

(Continued)

*Primary Examiner*—Thanh Nguyen

(57) ABSTRACT

A sub-micron, on the order of 80-nanometer diameter, resonant tunneling diode having a peak-to-valley ratio of approximately 5.1 to 1, and a method for its manufacture. The invention is unique in that its performance characteristics are unmatched in comparably sized resonant tunneling diodes. Further, the polyimide passivation and planarization methodology provides unexpected processing advantages with respect to application in the fabrication of resonant tunneling diodes. The invention includes a substrate 100 that serves as a foundation for bottom contact layers 102 and a polyimide 700 coating. An ohmic metal contact 300 and emitter metal contact 400 protrude above the polyimide 700 coating exposing the ohmic metal contact 300 and emitter metal contact 400. The contacts are capped with an etch-resistant coating 710 thus allowing for the polyimide etch, and other etching processes without adversely affecting the contacts.

12 Claims, 10 Drawing Sheets

OTHER PUBLICATIONS

R.P. Smith, S.T. Allen, M. Reddy, S.C. Martin, J. Liu, R. E. Muller, and M.J. W. Rodwell, "0.1 um Schottky-Collector AlAs/GaAs Resonant Tunneling Diodes", IEEE Electron Device Letters, vol. 15, No. 8, Aug. 1994, pp. 295-297.

K. Nomoto, K. Taira, T. Suzuki, I. Hase, H. Hiroshima, and M. Komuro, "Diameter dependence of current-voltage characteristics of ultrasmall area AlSb-InAs resonant tunneling diodes with diameters down to 20 nm," Appl. Phys. Lett. 70 (15), Apr. 14, 1997, pp. 2025-2027.

* cited by examiner

80 NANOMETER DIAMETER RESONANT TUNNELING DIODE WITH IMPROVED PEAK-TO-VALLEY RATIO

CROSS-REFERENCE TO RELATED APPLICATIONS

This divisional application claims the benefit of priority to U.S. utility application Ser. No. 09/924,699, filed in the U.S. on Aug. 7, 2001, now U.S. Pat. No. 6,566,284, entitled "Method of Manufacture for 90 Nanometer Diameter Resonant Tunneling Diode with Improved Peak-to-Valley Ratio and Resonant Tunneling Diode Therefrom."

FIELD OF THE INVENTION

The present invention generally relates to sub-micron resonant tunneling diodes and a process for their fabrication, and more specifically to sub-micron resonant tunneling diodes with improved peak-to-valley current ratios.

BACKGROUND OF THE INVENTION

As logic circuits continue to decrease in size and increase in speed, currently utilized semiconductor devices, such as transistors, may prove limiting. As such, novel types of semiconductor devices are under development to meet the requirements of high-speed circuitry. One such device is the resonant tunneling diode (RTD). Very generally, in devices of this type, the semiconductor layer structure includes thin layers of quantum wells that can permit low resistance, high speed electron tunneling. Such devices potentially provide increased high-speed switching, increased device density, and reduced power dissipation in logic circuits.

Currently, research on RTDs focuses on utilizing new fabrication technologies to reduce the size of these devices to the sub-micron level. Decreasing the size of these devices may reduce the capacitance and correspondingly increases the maximum frequency of oscillation for the device and, further, may reduce the requisite peak current for the device.

Decreasing the size of an RTD, however, has been limited by the increase in leakage current with the increase in surface-to-area ratio. Increased leakage current becomes a dominant factor in the current-voltage dependence of the device, and the increased leakage results in an increased valley current relative to the peak current. Thus, the peak-to-valley current ratio is reduced.

Nomoto, et al. reported successful fabrication of RTDs down to 20 nm in diameter. However, as noted above, the peak-to-valley ratios for these devices were limited by their dimensions. The peak-to-valley current ratio for the 20 mn device was less than 1.1 and thus the device is not practically useful in a circuit application. The 80 nm diameter device fabricated by the same researchers exhibited a somewhat better peak-to-valley current ratio of 1.2, with an attractively low peak current of 50 nA, but also exhibited a limiting peak current density of $10^3$ A/cm$^2$.

Smith, et al. reported fabricating a sub-micron RTD with an improved peak current density of $1.4 \times 10^5$ A/cm$^2$ and a peak-to-valley current ratio of 2.0. However, while this device was 100 nm across, it was also 10 mm long, and thus had a net area of 1 mm$^2$. This larger device size, while facilitating an improved peak-to-valley current ratio, also leads to higher power loss and higher peak current.

Therefore, it is desirable to have a sub-micron resonant tunneling diode with a favorable peak-to-valley ratio, lower peak current requirements and lower capacitance than larger RTDs.

SUMMARY OF THE INVENTION

The present invention relates generally to sub-micron diodes and more particularly to a sub-micron resonant tunneling diode with an improved peak to valley ratio. The device comprises a substrate in contact with a bottom contact layer and an ohmic metal contact in contact with the bottom contact layer. A top cap layer and quantum well structure is sandwiched between a top metal contact and the bottom contact layer. The top of the ohmic metal contact and the top of the top metal contact are substantially planar. A passivating substance in contact with the substrate fills all voids from the substrate to the top of the ohmic metal contact and the top of the top metal contact, substantially enveloping the bottom contact layer, the top cap layer and quantum well structure, the ohmic metal contact, and the top metal contact. The top of the ohmic metal contact and the top of the top metal contact are clear of the passivating substance.

In one embodiment of the present invention the layers of the device comprise the following:

| | |
|---|---|
| Substrate: | Inp |
| Bottom contact layer: | approximately 100 angstroms of undoped InGaAs; and approximately 3000 angstroms InGaAs doped at approximately $1 \times 10^{19}$ cm$^3$ |
| Top cap layer and quantum well structure: | |
| | approximately 70 angstroms of undoped InGaAs |
| | approximately 5.3 monolayers of undoped AlAs |
| | approximately 17 angstroms of undoped InGaAs |
| | approximately 12 angstroms of undoped InAs |
| | approximately 17 angstroms of undoped InGaAs |
| | approximately 5.1 monolayers of undoped AlAs |
| | approximately 70 angstroms of undoped InGaAs |
| | approximately 375 angstroms thick InGaAs doped at approximately $1 \times 10^{19}$ cm$^3$ |

A novel method for fabricating the sub-micron resonant tunneling diode is disclosed, which comprises providing a layered material comprising: a top cap layer and quantum well structure, a bottom contact layer, and a substrate. The top cap layer and quantum well structure is patterned to allow selective etching to the bottom contact layer. The top cap layer and quantum well structure is removed by etching as patterned. An ohmic metal is deposited to contact only the bottom contact layer and a top metal contact is selectively deposited, using a pattern, on the top cap layer and quantum well structure. This is followed by removing the top cap layer and quantum well structure except where masked by the top metal contact and removing the non-local bottom contact layer to form a device. The device is then passivated using a passivating substance in contact with the substrate that fills all voids from the substrate to the top of the ohmic metal and the top metal contacts, substantially enveloping the following: the bottom contact layer, the top cap layer and quantum well structure, the ohmic metal contact, and the top metal contact. The passivating substance covering the top of the ohmic metal contact and the top of the top metal contact is etched away, revealing the contacts for testing and operation. In this invention the tops of the ohmic metal contact and the top metal contact are substantially planar. In one embodiment, the ohmic metal contact and the top metal contact further comprise a cap layer of Titanium.

DETAILED DESCRIPTION OF THE INVENTION

The present invention provides a sub-micron resonant tunneling diode and a method for its fabrication and may be tailored to a variety of other applications. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein. Furthermore it should be noted that unless explicitly stated otherwise, the figures included herein are illustrated diagrammatically and without any specific scale, with the express clarification that as the figures are specifically examples, no restrictive or exclusive character should be assigned to them, their purpose being merely illustrative of the fundamental concept on which the invention is based. Additionally, for the purpose of this disclosure, the term "device" shall be understood to refer to an embodiment of the invention at various stages of fabrication, even when the invention is not operative.

The invention provides for a sub-micron, on the order of 80-nanometer diameter, resonant tunneling diode having a peak-to-valley ratio of approximately 5.1 to 1, and a method for its manufacture. The invention is unique in that its performance characteristics are unmatched in comparably sized resonant tunneling diodes. Further, the polyimide passivation and planarization methodology provides unexpected processing advantages with respect to application in the fabrication of resonant tunneling diodes.

Figure 1:
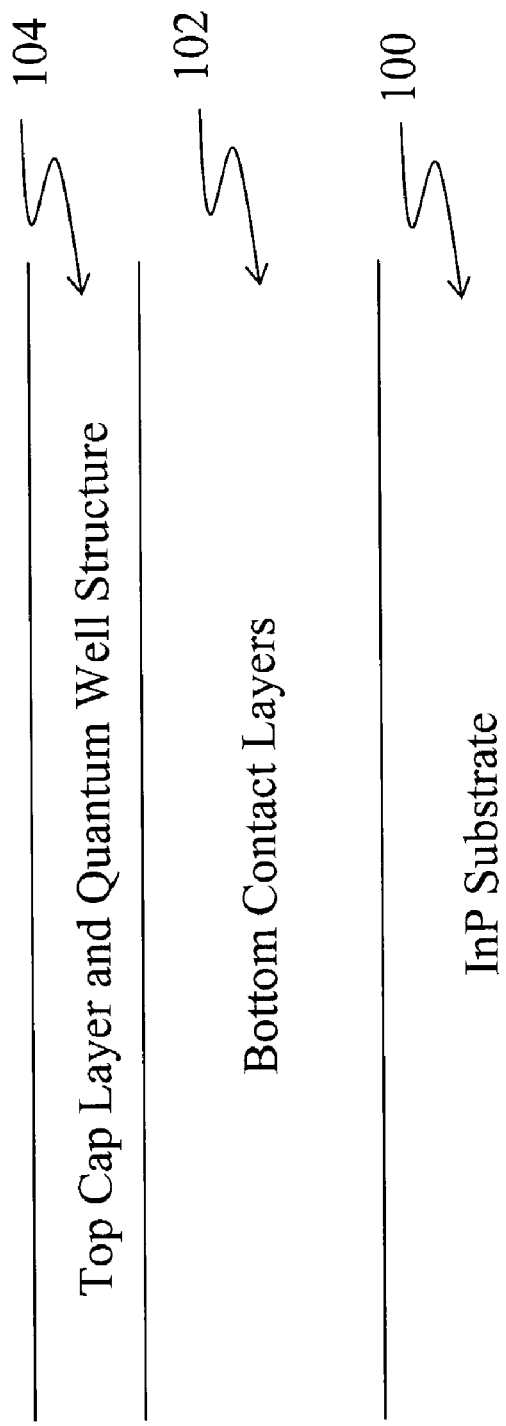
FIG. 1 is a diagram showing the basic overall layer formation of the starting materials of an embodiment of the present invention.

A general depiction of a resonant tunneling diode fabrication sequence according to the present invention is diagrammatically illustrated in the following figures. Initially, a suitable substrate is selected, shown in FIG. 1 as an Indium Phosphate substrate 100. After the substrate 100 has been suitably prepared, a plurality of bottom contact layers 102 is disposed upon the substrate 100. A plurality of different materials comprises the bottom contact layers 102, a partial listing is provided herein. After the bottom contact layers 102 are in place, a top cap layer and quantum well structure 104 is disposed upon the bottom contact layers 102. The general layered semiconductor structure of the present invention is shown schematically in FIG. 1. As was indicated above the drawing is not to scale, and no meaning should be ascribed to the relative thicknesses depicted.

Figure 2A:
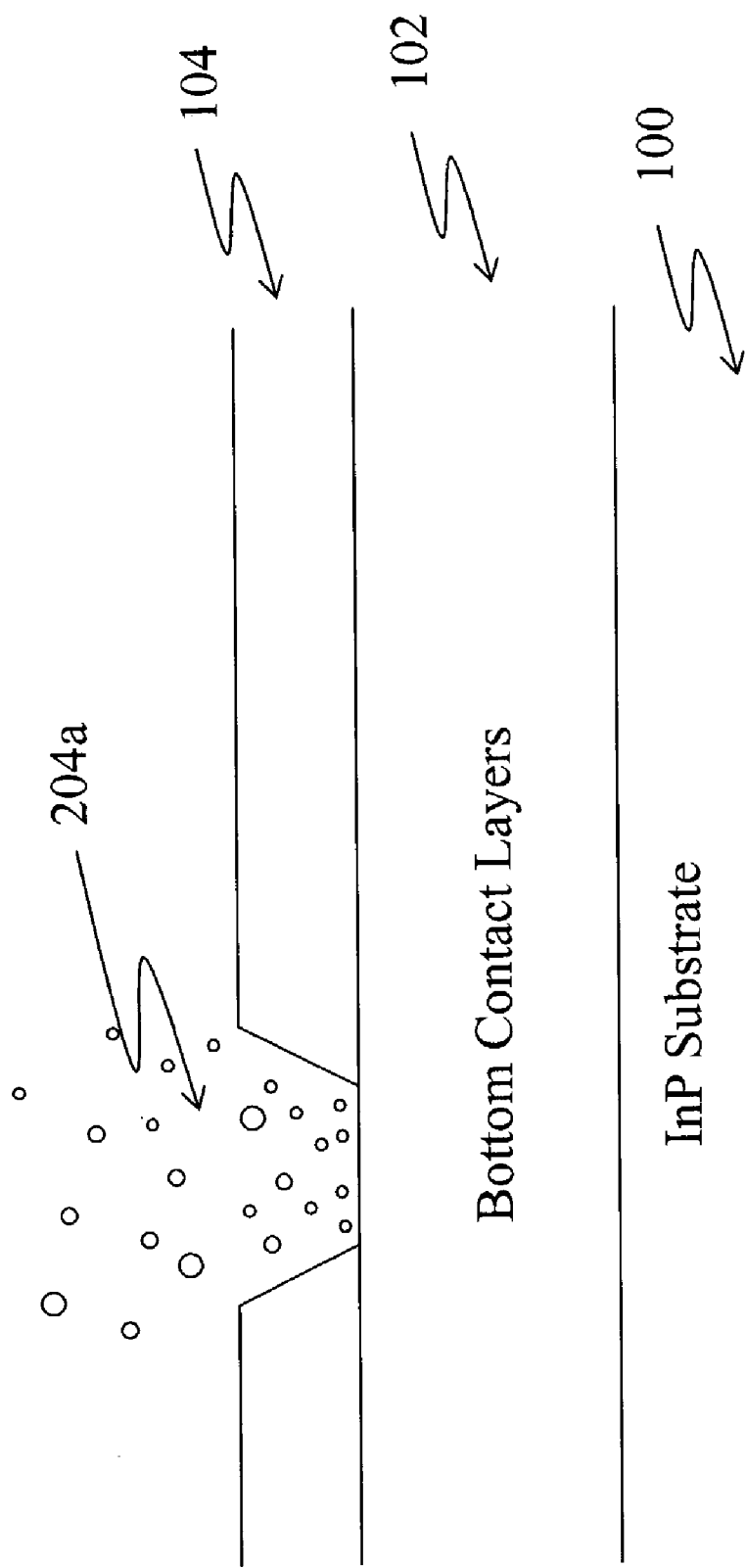
FIG. 2a is a diagram showing the localized removal of the top cap layer and quantum well structure of the formation.
Figure 2B:
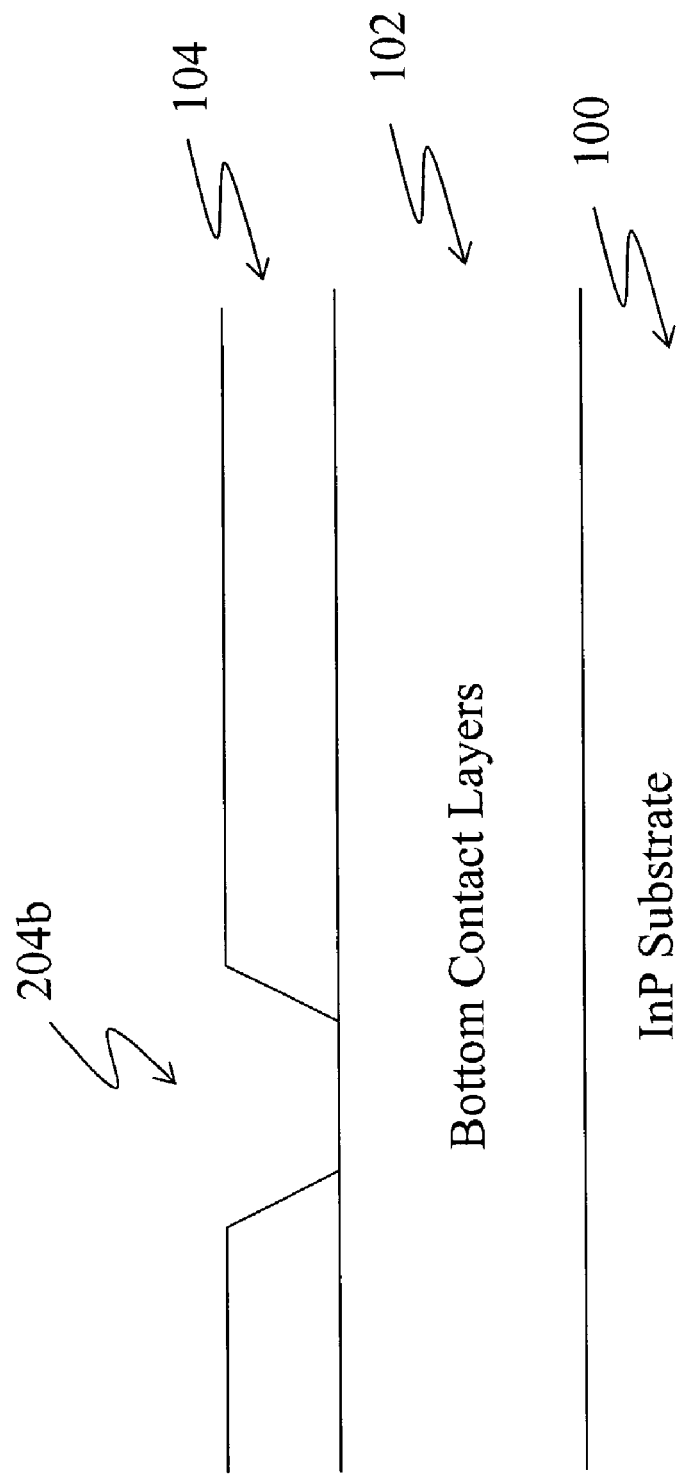
FIG. 2b is a diagram showing the device after the removal of the top cap layer and quantum well structure.

Referring to FIG. 2a and FIG. 2b and utilizing the general semiconductor formation as outlined in the preceding paragraph, the bottom contact layers 102 are first patterned for an ohmic metal contact. The top cap layer and quantum well structure 104 of the formation is then removed at the site. This is depicted in FIG. 2a, where after fabrication of the basic layered semiconductor formation, as set forth in FIG. 1, the bottom contact layers 102 are patterned so that the formation is configured to receive an ohmic metal contact. The top cap layer and quantum well structure 104 of the formation is then selectively etched at the site 204a where the ohmic metal contact will be deposited. It should be noted that the top cap layer and quantum well structure 104 is removed such that the bottom contact layers 102 are exposed. In FIG. 2b the device is depicted after the top cap layer and quantum well structure 104 has been selectively removed and the opening 204b and device are ready for an ohmic metal contact.

Figure 3:
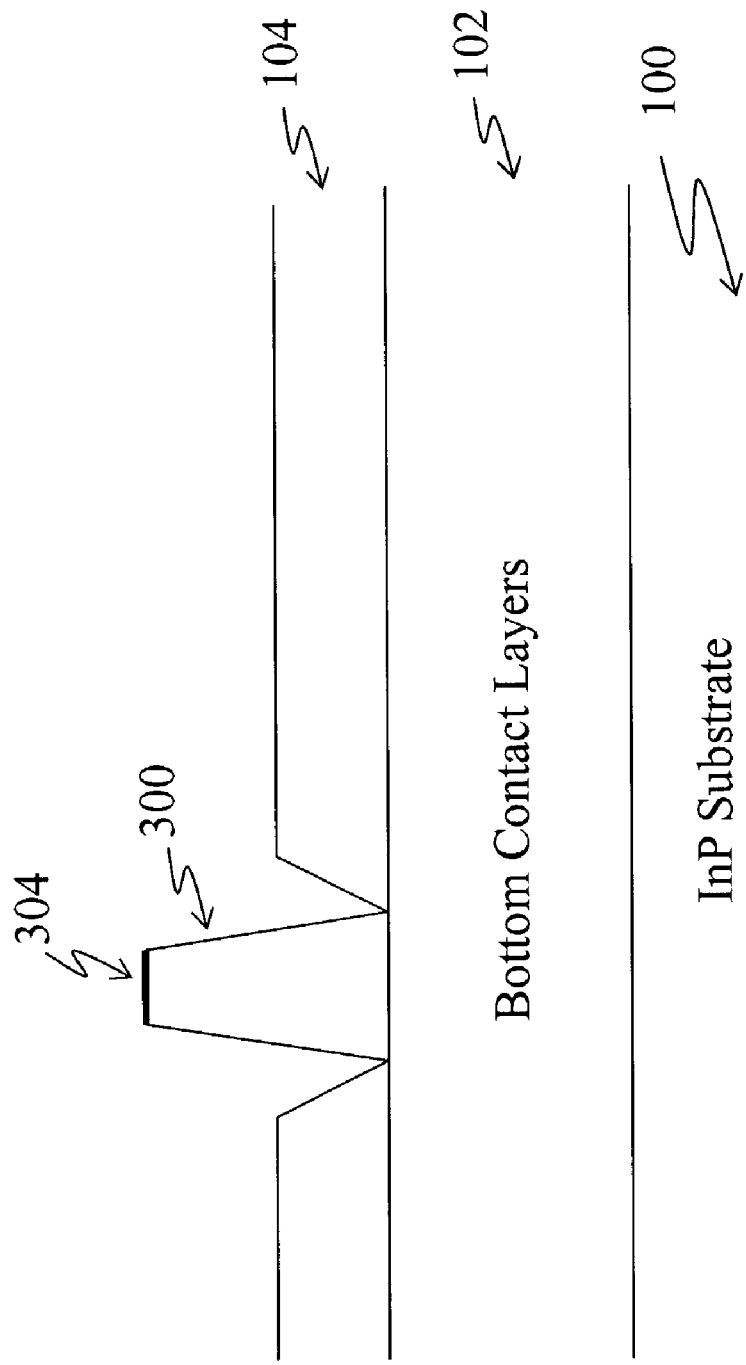
FIG. 3 is a diagram showing the deposition of the ohmic metal contact.

In FIG. 3, the ohmic metal contact 300 is deposited. The ohmic metal contact 300 is a material suitable for an ohmic metal contact for the semiconductor structure. The ohmic metal contact 300 thickness is selected to match a defined resultant thickness of an emitter metal contact 400 (shown in FIG. 4) plus the top cap layer and quantum well structure 104. This ohmic metal contact 300 includes a top layer of an etchant resistant material 304, such as titanium, to be used as a subsequent etch mask. In one embodiment of the invention, this ohmic metal contact 300 is a layered structure of titanium, platinum, gold, and titanium. The ohmic metal contact 300, when finally positioned, is in electrical contact with the bottom contact layers 102.

Figure 4:
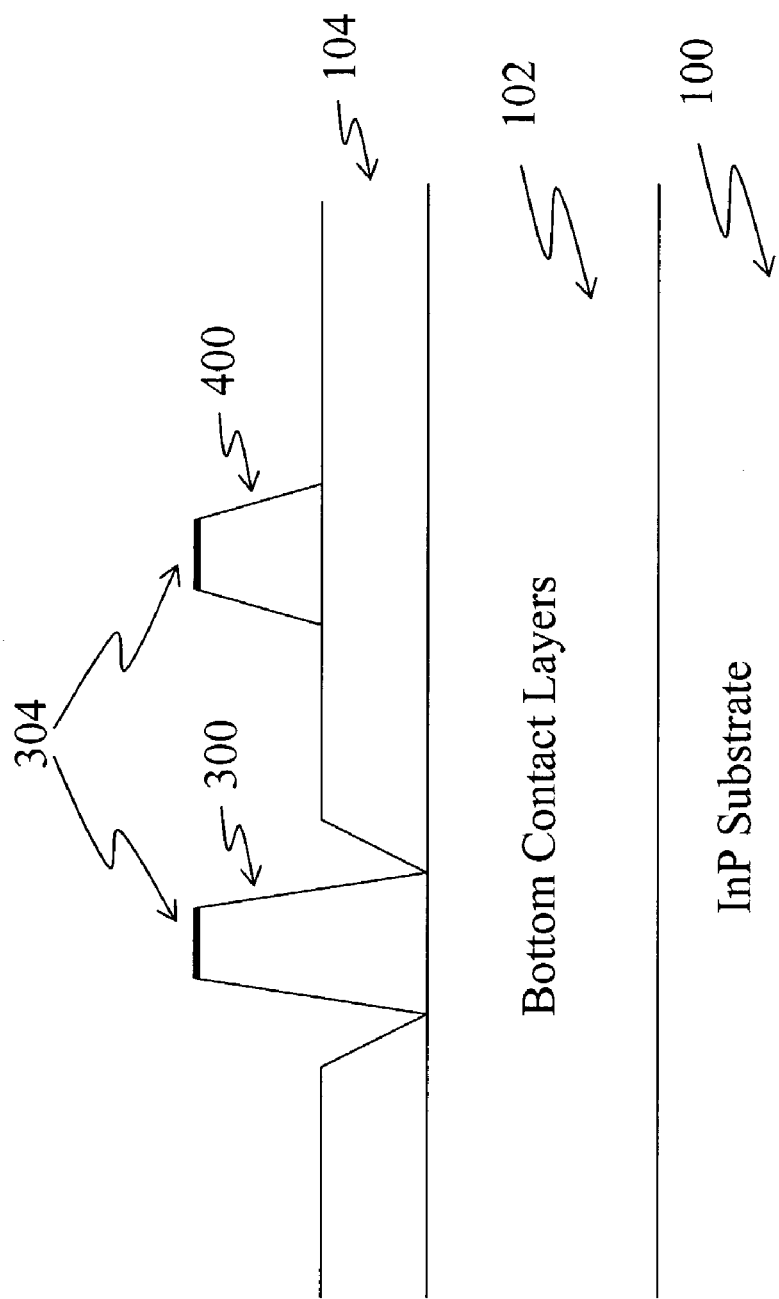
FIG. 4 is a diagram showing the patterning of a suitable emitter metal contact.

After deposition of the ohmic metal contact 300, and as shown in FIG. 4, a suitable emitter metal contact 400 is patterned. The emitter metal contact 400 is deposited on the top cap layer and quantum well structure 104. As noted above, the emitter metal contact 400 is designed so that its thickness plus the thickness of the top cap layer and quantum well structure 104 is equivalent to the thickness of the ohmic metal contact 300. In one embodiment of the present invention, the emitter metal contact 400 is patterned by electron beam lithography and subsequently deposited using lift-off processing techniques. As described above for the ohmic metal contact 300, the emitter metal contact 400 also has a top layer 304 of titanium or other etch resistant material to be used as a subsequent dry etch mask. In this step, shown in FIG. 4, the emitter metal contact 400 is brought into contact with the remaining top cap layer and quantum well structure 104. The emitter metal contact 400, like the ohmic metal contact 300, has a top layer of titanium 304. Once the device is as shown in FIG. 4, an etching step is commenced.

Figure 5:
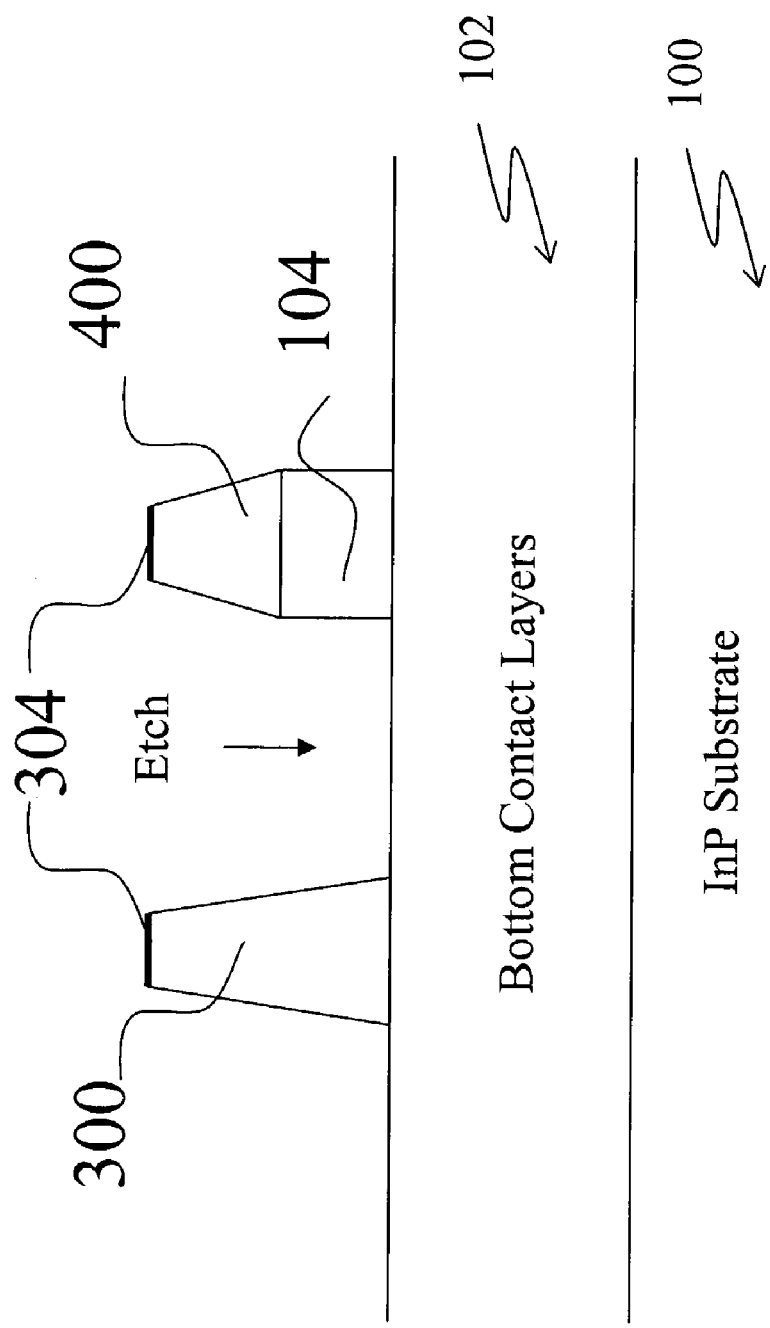
FIG. 5 is a diagram showing a dry etch being utilized to remove most of the bottom collector layers outside the active region.

The result of the etching step is shown in shown in FIG. 5. Upon deposition of the ohmic metal contact 300 and emitter metal contact 400, a dry etch is utilized to remove most of the top cap layer and quantum well structure 104 outside the active region. The ohmic metal contact 300 and the emitter metal contact 400, because of their etch-resistant caps 304, are substantially impervious to the effects of the etchant. The etching process removes the remaining portions of the top cap layer and quantum well structure 104 that are not shielded by the emitter metal contact 400.

Figure 6:
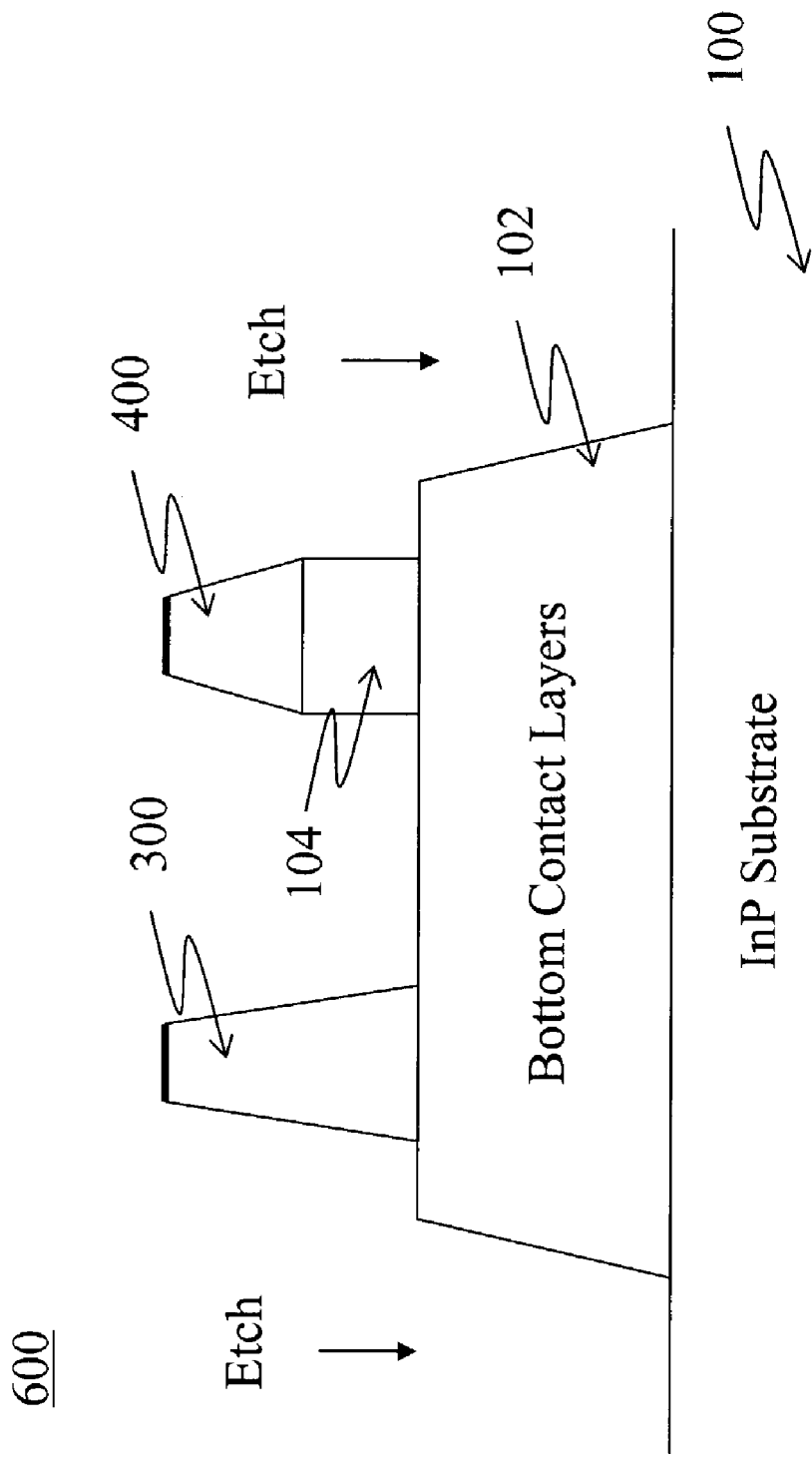
FIG. 6 is a diagram showing a selective wet etch configured to substantially isolate the device.
Figure 7A:
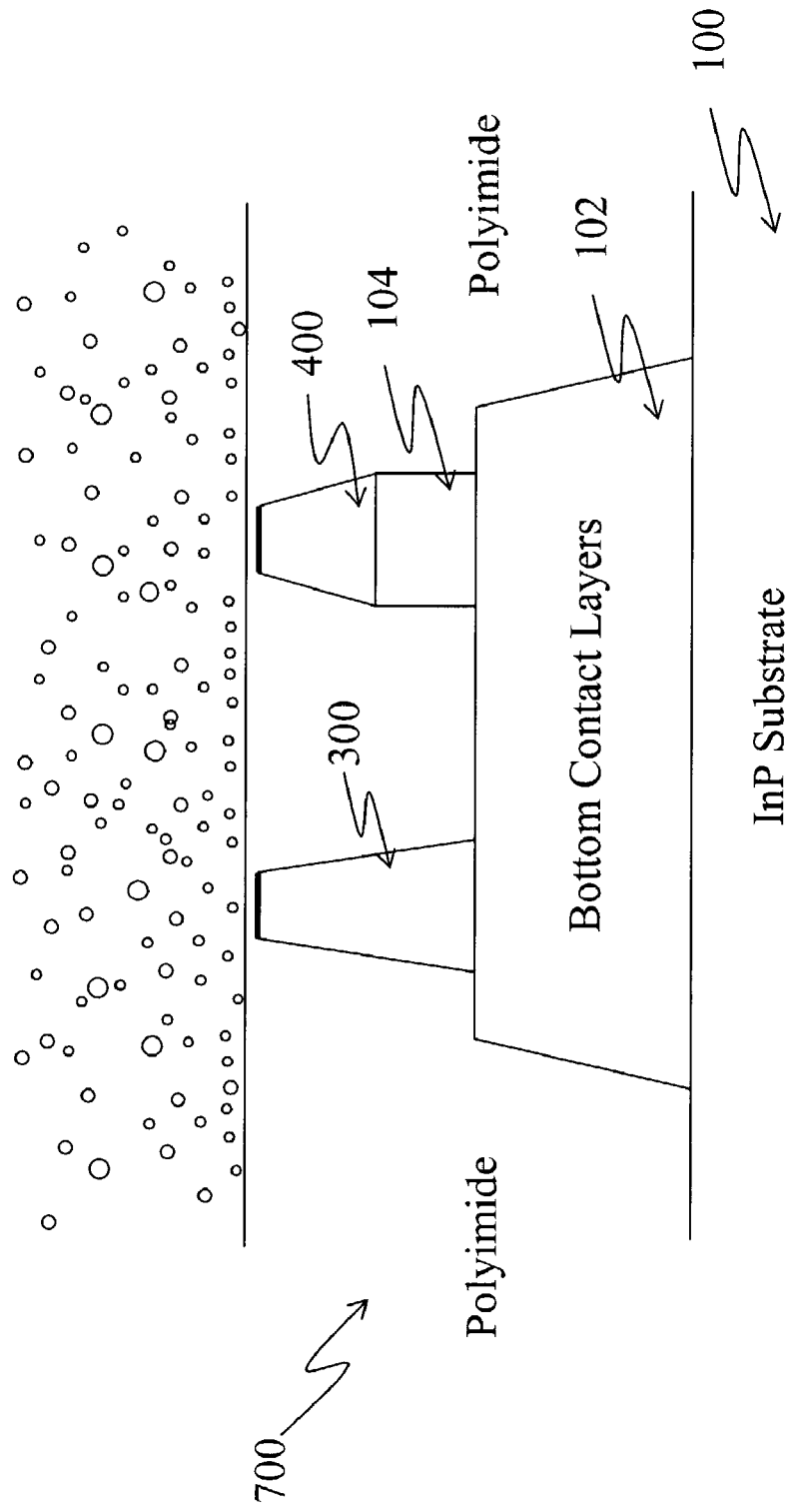
FIG. 7a is a diagram showing the device covered with polyimide and being etched back to expose the equivalent thickness ohmic metal contact and emitter metal contact.
Figure 7B:
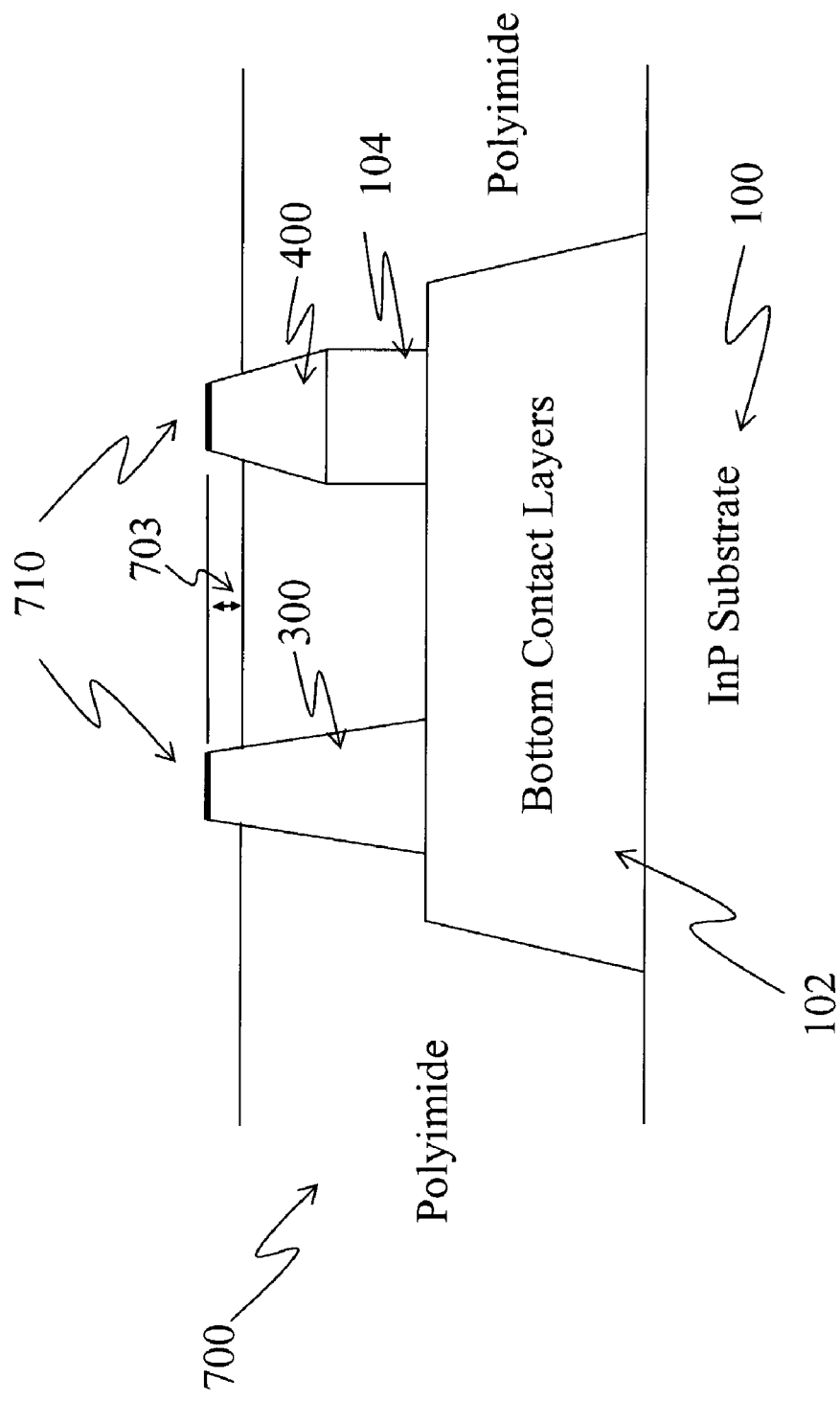
FIG. 7b is a diagram showing the device after the polyimide has been etched back to expose the ohmic metal contact and emitter metal contact.

This procedure is followed by a selective wet etch, shown in FIG. 6 to completely isolate the resulting device 600. This selective etch process is also utilized to maintain a consistent device height across the substrate to facilitate polyimide planarization. In FIG. 7a, the device is covered with polyimide 700, which is then etched back to expose the equivalent thicknesses 703 of the ohmic metal contact 300 and the emitter metal contact 400. A top metal layer is then patterned and deposited on the ohmic metal contact 300 and emitter metal contact 400 to permit connection of the device for testing and operation. In FIG. 7b a final version of the device is presented. The substrate 100 serves as a foundation for the bottom contact layers 102 and the polyimide 700 coating. The ohmic metal contact 300 and emitter metal contact 400 protrude above the polyimide 700 coating exposing the contacts. The ohmic metal contact 300 and emitter metal contact 400 are both capped with an etch-resistant coating 710 thus allowing the polyimide etch without adversely affecting the contacts.

Figure 8:
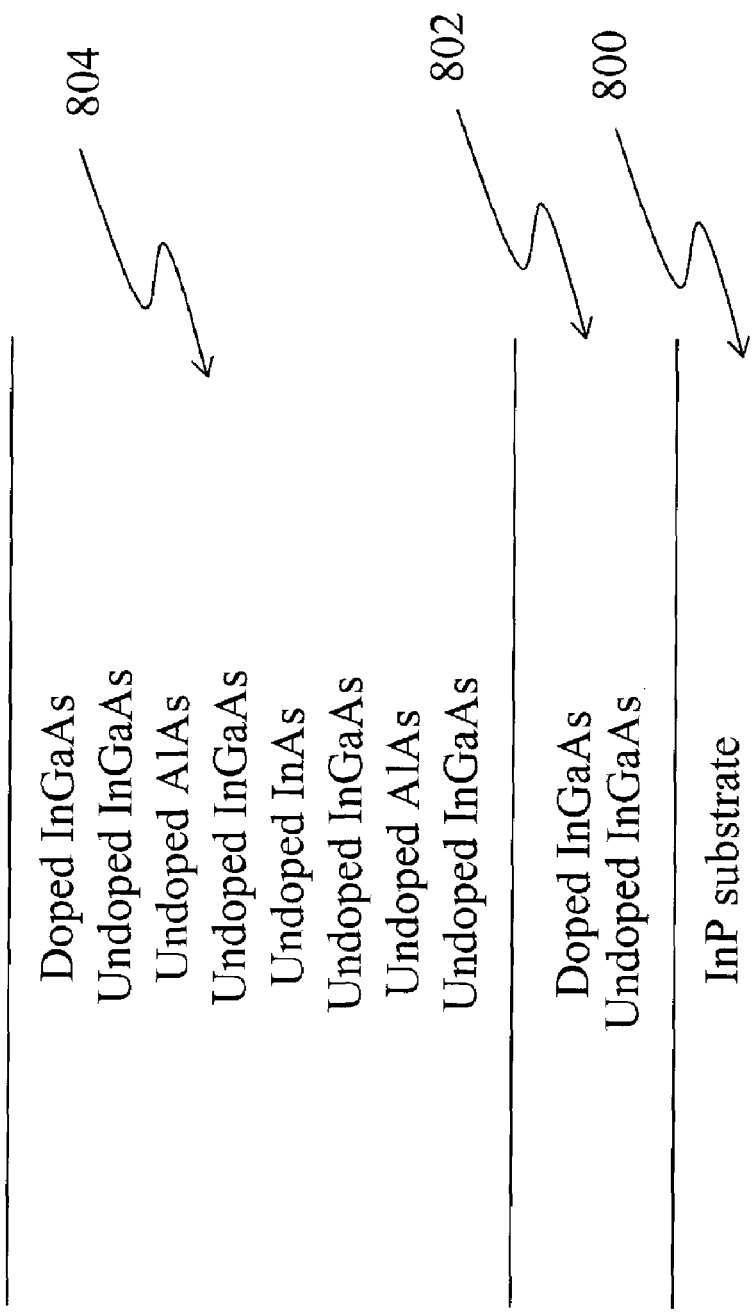
FIG. 8 is a diagram showing the layered semiconductor structure of a specific embodiment.

In one embodiment of the present invention, as depicted in FIG. 8, the layered semiconductor structure is grown on a III-V type semiconductor substrate 800. In one embodiment, this substrate is Indium Phosphide (InP). The bottom contact layers 802 include 100 Angstroms of undoped InGaAs and 3000 Angstroms of n-doped InGaAs doped at $1 \times 10^{19}$ cm$^{-3}$. The top cap layer and quantum well structure 804 from bottom to top are as follows: 70 Angstroms of undoped InGaAs, 5.3 monolayers undoped AlAs, 17 Angstroms of undoped InGaAs, 12 Angstroms undoped InAs, 17 Angstroms undoped InGaAs, 5.1 monolayers undoped AlAs, 70 Angstroms undoped InGaAs, and 375 Angstroms n-doped InGaAs doped at $1 \times 10^{19}$ cm$^{-3}$.

What is claimed is:

1. A semiconductor, comprising:
a sub-micron resonant tunneling diode having a peak-to-valley current ratio of greater than 4 to 1, including:
a. a substrate;
b. bottom contact layer contacting substrate;
c. an ohmic metal contact in contact with the bottom contact layer;
d. a top cap layer and quantum well structure sandwiched between a top metal contact and the bottom contact layer, wherein a top of the ohmic metal contact and a top of the metal contact are substantially planner;
e. a passivating substance in contact with the substrate that substantially fills all voids from the substrate to substantially the top of the ohmic metal contact and the top of the top metal contact, substantially enveloping the following:
i. the bottom contact layer;
ii. the top cap layer and quantum well structure;
iii. the ohmic metal contact; and
iv. the top metal contact;
wherein the top of the ohmic metal contact and the top metal contact are substantially free of the passivating substance, such that a portion of the ohmic metal contact and a portion of the top metal contact are exposed parallel to or above the passivating substance.

2. The apparatus as set forth in claim 1, wherein the ohmic metal contact and the top metal contact further comprise a cap layer of an etchant-impervious material.

3. The apparatus as set forth in claim 2, wherein the etchant-impervious material is comprised substantially of titanium.

4. The apparatus as set forth in claim 1, wherein the passivating substance is polyimide.

5. The apparatus as set forth in claim 1, wherein the substrate is Indium Phosphide.

6. The apparatus as set forth in claim 1, wherein the bottom contact layer comprises a plurality of substantially conforming layers, including:
a. approximately 100 angstroms of undoped InGaAs; and
b approximately 3000 angstroms InGaAs doped at approximately $1 \times 10^{19}$ cm$^3$;
wherein the layers are substantially in contact with one another.

7. The apparatus as set forth in claim 1, wherein the top cap layer and quantum well structure comprises a plurality of substantially conforming layers, including:
approximately 70 angstroms of undoped InGaAs;
approximately 5.3 monlayers of undoped AlAs;
approximately 17 angstroms of undoped InGaAs;
approximately 12 angstroms of undoped InAs;
approximately 17 angstroms of undoped InGaAs;
approximately 5.1 monolayers of undoped AlAs;
approximately 70 angstroms of undoped InGaAs; and
approximately 375 angstroms of InGaAs doped at approximately $1 \times 10^{19}$ cm$^3$.

8. The apparatus as set forth in claim 1, wherein:
the substrate substantially comprises InP;
the bottom contact layer comprises a plurality of substantially conforming layers, including:
approximately 100 angstroms of undoped InGaAs; and
approximately 3000 angstroms InGaAs doped at approximately $1 \times 10^{19}$ cm$^3$; and
the top cap layer and quantum well structure comprises a plurality of substantially conforming layers, including:
approximately 70 angstroms of undoped InGaAs;
approximately 5.3 monolayers of undoped AlAs;
approximately 17 angstroms of undoped InGaAs;
approximately 12 angstroms of undoped InAs;
approximately 17 angstroms of undoped InGaAs;
approximately 5.1 monolayers of undoped AlAs;
approximately 70 angstroms of undoped InGaAs; and
approximately 375 angstroms of InGaAs doped at approximately $1 \times 10^{19}$ cm$^3$.

9. The apparatus as set forth in claim 1, wherein the ohmic metal contact layer is comprised of one of the following:
a layer combination of Titanium/Platinum/Gold/Titanium; or
any standard ohmic metallization for n-type InGaAs with an etchant-impervious top layer.

10. The apparatus as set forth in claim 9, wherein the etchant-impervious top layer is titanium.

11. The apparatus as set forth in claim 1, wherein the top cap layer is titanium.

12. The apparatus as set forth in claim 1, wherein the substance is Indium Phosphite.

* * * * *